(12) United States Patent
Ho et al.

(10) Patent No.: US 9,214,417 B2
(45) Date of Patent: Dec. 15, 2015

(54) COMBINED PACKAGED POWER SEMICONDUCTOR DEVICE

(71) Applicants: Yueh-Se Ho, Sunnyvale, CA (US); Hamza Yilmaz, Saratoga, CA (US); Yan Xun Xue, Los Gatos, CA (US); Jun Lu, San Jose, CA (US)

(72) Inventors: Yueh-Se Ho, Sunnyvale, CA (US); Hamza Yilmaz, Saratoga, CA (US); Yan Xun Xue, Los Gatos, CA (US); Jun Lu, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/186,275

(22) Filed: Feb. 21, 2014

(65) Prior Publication Data

US 2015/0243589 A1 Aug. 27, 2015

Related U.S. Application Data

(63) Continuation of application No. 13/077,720, filed on Mar. 31, 2011, now Pat. No. 8,686,546, which is a continuation-in-part of application No. 12/819,111, filed on Jun. 18, 2010, now Pat. No. 8,581,376.

(51) Int. Cl.
*H01L 23/495* (2006.01)
*H01L 27/088* (2006.01)

(52) U.S. Cl.
CPC .... *H01L 23/49568* (2013.01); *H01L 23/49503* (2013.01); *H01L 27/088* (2013.01)

(58) Field of Classification Search
CPC ............ H01L 23/49568; H01L 27/088; H01L 23/49503
See application file for complete search history.

(56) References Cited

U.S. PATENT DOCUMENTS

| | | | |
|---|---|---|---|
| 8,686,546 B2 * | 4/2014 | Ho et al. | 257/676 |
| 2010/0155915 A1 * | 6/2010 | Bell et al. | 257/676 |
| 2011/0309454 A1 * | 12/2011 | Ho et al. | 257/392 |
| 2012/0119343 A1 * | 5/2012 | Bayan et al. | 257/676 |
| 2013/0214399 A1 * | 8/2013 | Joshi et al. | 257/676 |
| 2014/0061884 A1 * | 3/2014 | Carpenter et al. | 257/676 |

* cited by examiner

*Primary Examiner* — Long Pham
(74) *Attorney, Agent, or Firm* — Chein-Hwa S. Tsao; Chen-Chi Lin

(57) ABSTRACT

A combined packaged power semiconductor device includes flipped top source low-side MOSFET electrically connected to top surface of a die paddle, first metal interconnection plate connecting between bottom drain of a high-side MOSFET or top source of a flipped high-side MOSFET to bottom drain of the low-side MOSFET, and second metal interconnection plate stacked on top of the high-side MOSFET chip. The high-side, low-side MOSFET and the IC controller can be packaged three-dimensionally reducing the overall size of semiconductor devices and can maximize the chip's size within a package of the same size and improves the performance of the semiconductor devices. The top source of flipped low-side MOSFET is connected to the top surface of the die paddle and thus is grounded through the exposed bottom surface of die paddle, which simplifies the shape of exposed bottom surface of the die paddle and maximizes the area to facilitate heat dissipation.

6 Claims, 9 Drawing Sheets

COMBINED PACKAGED POWER SEMICONDUCTOR DEVICE

PRIORITY CLAIM

This application is a continuation and claims the priority benefit of a U.S. patent application Ser. No. 13/077,720 filed Mar. 31, 2011, the entire disclosures of which are incorporated herein by reference.

TECHNOLOGY FIELD

This invention relates to a power semiconductor device, especially to a package structure that combines semiconductor chips and other components in the same power semiconductor device.

BACKGROUND

Currently, a typical power semiconductor device usually combines metal oxide semiconductor field effect transistors (MOSFETs) and an integrated circuit (IC) controller in one package to reduce number of peripheral devices and improve the utilization efficiency of power supplies and other components. For a double diffused metal oxide semiconductor field effect transistor (DMOSFET) having a source on its top surface, the top source of the chip usually is connected to an exposed die paddle of a lead frame and thus is grounded.

To achieve the above said package structure, the chip has to be flipped and attached to the lead frame die paddle, which will face some difficulties, such as the optimization of the size and simplification of the shape of the exposed die paddle of lead frame, the achievement of the connection between the chip source and the die paddle to optimize heat dissipation, and the achievement of a good interconnection between the gate on top of the chip and the IC controller for such a flip chip configuration.

A specific existing semiconductor device package as shown in FIG. 1 is made according to the circuit diagram in FIG. 2, which contains a P-type high-side (HS) MOSFET, a N-type low-side (LS) MOSFET and an IC controller that are installed on one lead frame. The installation space of the package limits the size of the HS MOSFET, LS MOSFET and IC controller, which have a great impact on the improvement of performance of power semiconductor device.

However, in the above package structure, electrodes on top surface of the LS MOSFET connect to the HS MOSFET, the IC controller or external components directly through bonding wires, which may be connected to the same pin. Therefore, it is difficult to install a flip chip to connect the source on its top surface with the die paddle, and it is impossible to make the exposed die paddle as electrode ground and to improve the heat dissipation effect.

SUMMARY

This invention provides a combined packaged, or co-packaged, power semiconductor device including semiconductor chips, such as HS and LS MOSFETs with top source, top gate and bottom drain, and an IC controller in one package. The overall size of co-packaged power semiconductor device is reduced, and the size of the semiconductor chips is enlarged with the same package size, which effectively improve the performance of semiconductor device. The electrical connection between the source of the flip chip with the die paddle is achieved and the exposed area at the bottom surface of the die paddle is grounded and maximized that improves heat dissipation.

This invention provides methods of combined packaging for the above power semiconductor device. The method is started with a lead frame including a die paddle and a plurality of pins that are separated and electrically insulated from the die paddle. The LS MOSFET chip is flipped and stacked on the die paddle, forming an electrical connection between the LS source and a top surface of the die paddle, thus the LS source is grounded through the exposed bottom surface of the die paddle. A first metal interconnection plate is attached on the drain of the LS MOSFET. HS MOSFET is either directly attached or flipped first and then attached on the first metal interconnection plate, forming electrical connections between a drain of HS MOSFET or a source of flipped HS MOSFET and the drain of the LS MOSFET through the first metal interconnection plate.

A second metal interconnection plate is attached on and electrically connected to the source of HS MOSFET or the drain of flipped HS MOSFET. The IC controller is also stacked on the die paddle. The IC controller includes a plurality of electrodes and electrical connections between the pins of the lead frame, the electrodes on the IC controller and the electrodes of HS and LS MOSFETs are formed through bonding wires.

In a preferred embodiment, the lead frame pins include a LS gate pin including an outer portion and an inner portion. A matching gap is made on said die paddle at the corresponding position to that of inner portion to separate the LS gate pin from the die paddle. The gate of the flipped LS MOSFET is attached on the inner portion and thus forms an electrical connection with the LS gate pin. The inner portion of the LS gate pin includes a half etched area, which is filled with plastic material in packaging process The half etched area is also formed on a side of the die paddle corresponding to the inner portion with a width matching to that of the inner portion and is also filled with plastic material in packaging process to enhance the connection strength in the device and maximizes the exposed bottom surface of the die paddle. The IC controller is electrically connected to the LS gate pin's outer portion through bonding wires.

In another preferred embodiment, the combined packaged power semiconductor device also includes a second interposer. The gate of flipped LS MOSFET is attached and electrically connected to a conductive top surface of the second interposer. The bottom surface of the second interposer is attached to and electrically insulated from die paddle. The source of the flipped LS MOSFET is electrically connected to the die paddle through a thick conductive adhesive.

In an improved structure of this embodiment, a second groove is formed in a top portion of the die paddle corresponding to the position of the gate of the LS MOSFET. The second interposer is placed in the second groove and is electrically insulated from the die paddle. The second interposer can be a conductive metal plate, which is attached on the die paddle or in the second groove through a non-conductive adhesive at its bottom surface. Alternatively, the second interposer maybe include a conductive metal upper layer and an insulated lower layer with the bottom surface of the insulated lower layer attached on the die paddle in the second groove through either conductive or non-conductive adhesive. The IC controller is electrically connected to the top surface of the second interposer, thus forming electrical connection with gate of the flipped LS MOSFET.

In another preferred embodiment, the IC controller is attached to and electrically insulated from the die paddle. The flipped LS MOSFET is attached to and covers a portion at top surface of the IC controller, thus electrical connection between some electrodes on the IC controller and the gate and a portion of source of the LS MOSFET are formed, which eliminates the utilization of bonding wires and simplifies the packaging process. Furthermore, the IC controller is also packaged three-dimensionally in this structure, thus reducing the overall thickness of power semiconductor device. The remaining portion of the sources of LS MOSFET is electrically connected to the die paddle through a thick conductive adhesive.

In an improved structure of this embodiment, a chip groove is formed on a top portion of the die paddle. The IC controller is then placed in the chip groove and is electrically insulated from the die paddle. The combined packaged power semiconductor device also includes the first interposer. The gate of the flipped HS MOSFET is electrically connected to the conductive top surface of the first interposer.

The bottom surface of the first interposer is attached on and electrically insulated from the first metal interconnection plate. The source of the HS MOSFET is electrically connected to the first metal connectors through a thick conductive adhesive.

In an improved structure of this embodiment, a first groove is formed on a top portion of the first metal interconnection plate corresponding to the position of the gate of the HS MOSFET for housing the first interposer that is electrically insulated from the first metal interconnection plate. The first interposer can be a conductive metal plate, which is attached on the first metal interconnection plate or in the first groove through a non-conductive adhesive at its bottom surface. Alternatively, the first interposer may include a conductive metal upper layer and an insulated lower layer with the bottom surface of the insulated lower layer attached on the first metal interconnection plate or in the first groove through either a conductive or a non-conductive adhesive. The IC controller is electrically connected to the top surface of the first interposer, forming electrical connection with the gate of the flipped HS MOSFET. Source and gate of the HS MOSFET or bottom drain of flipped HS MOSFET are electrically connected to the IC controller by bonding wires.

The lead frame pins also include switch pins that are electrically connected with the first metal interconnection plate. The IC controller is connected to the switch pins through bonding wires, thus forming electrical connections with the first metal interconnection plate. The lead frame pins also includes HS source pins electrically connected to the source of the HS MOSFET through the second metal interconnection plate. The lead frame pins also includes HS drain pins electrically connected to the drain of the flipped HS MOSFET through the second metal interconnection plates.

SPECIFIC EMBODIMENTS

Some preferred embodiments of this invention according to FIG. 4 to FIG. 18 are described below in detail for better understanding the technical solution and useful effects of this invention.

In the following embodiments, an IC controller is connected to HS and LS MOSFETs, all of which are co-packaged in the same package forming a power semiconductor device. It should be noted that these specific descriptions and examples are not for the purpose of limiting the scope of this invention.

Figure 1:
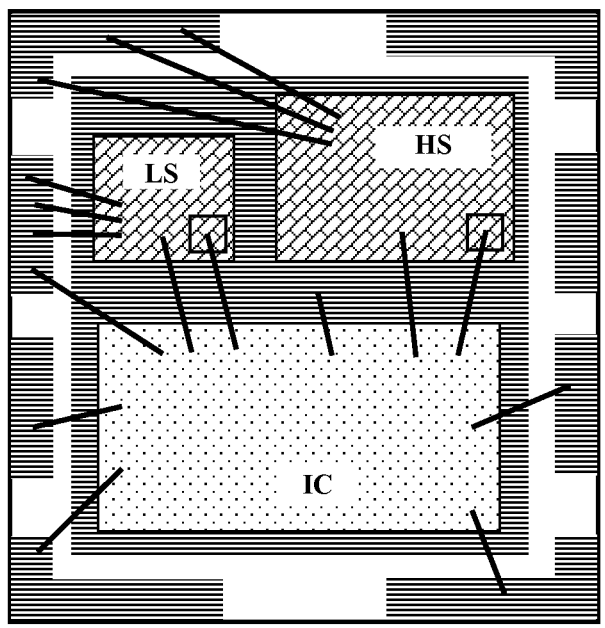
FIG. 1 is a schematic diagram of an existing co-package of a power semiconductor device.
Figure 2:
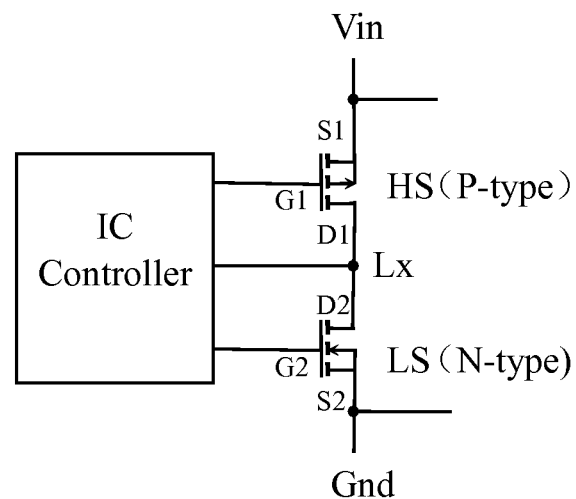
FIG. 2 is a circuit diagram for a co-package of a HS P-type MOSFET, a LS N-type MOSFET and an IC controller.

As shown in FIG. 2, a LS MOSFET is an N-type MOSFET, while the HS MOSFET is a P-type MOSFET. Both of the HS and LS MOSFETs have bottom drain, top source and top gate electrodes. In this configuration, the LS MOSFET is flipped. Gate G1 of HS MOSFET and gate G2 of LS MOSFET are both connected to an IC controller. The source S1 of HS MOSFET is connected to a power access terminal Vin, with its drain D1 connected to drain D2 of LS MOSFET at a switch terminal Lx connecting to the IC controller, while source S2 of LS MOSFET connects to the ground.

Figure 3:
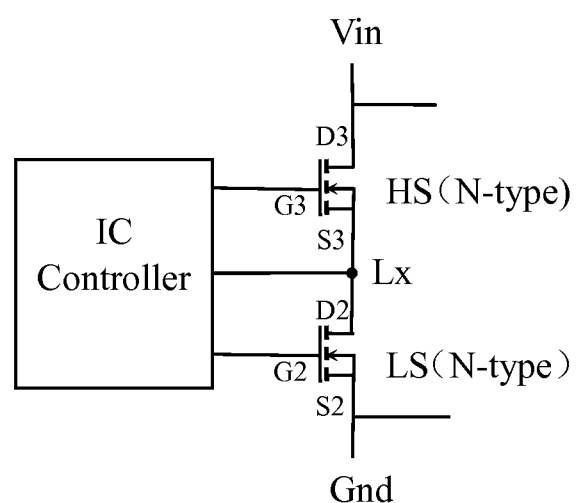
FIG. 3 is a circuit diagram for a co-package of the N-type HS and LS MOSFETs and the IC controller.

As shown in FIG. 3, both of the HS and LS MOSFETs are N-type MOSFETs having bottom drain, top source and top gate electrodes. In this configuration, both HS and LS MOS- FETs are flip chips. A gate G3 of HS MOSFET and a gate G2 of LS MOSFET are both connected to the IC controller. The drain D3 of HS MOSFET is connected with a power access terminal Vin, with its source S3 connected with drain D2 of LS MOSFET at a switch terminal Lx that connects to the IC controller, while source S2 of LS MOSFET connects to the ground.

Figure 4:
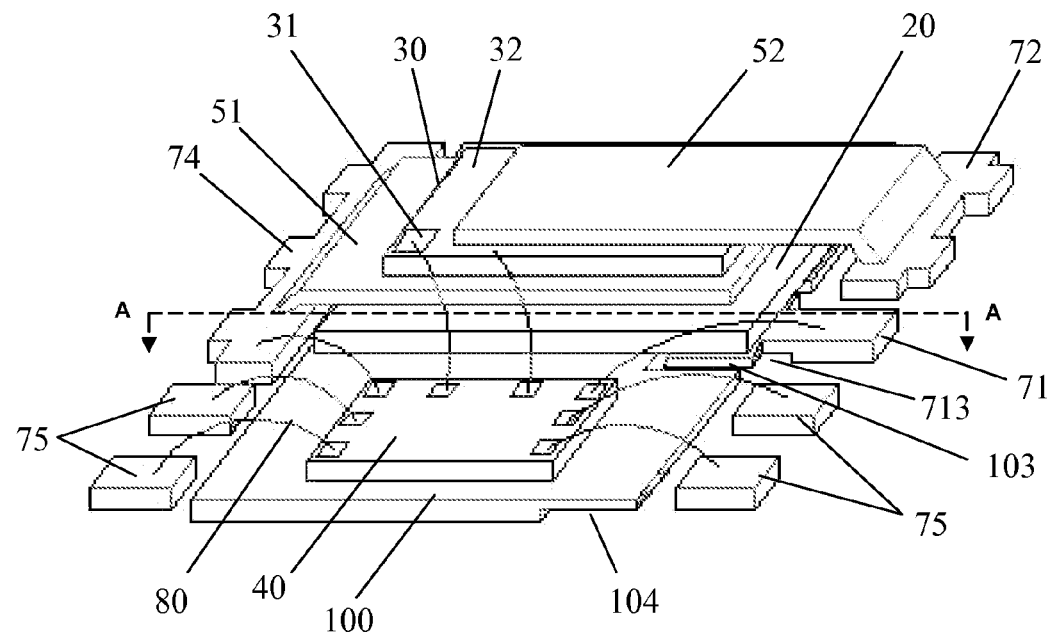
FIG. 4 is a three-dimensional diagram illustrating a co-package of power semiconductor device corresponding to the circuit diagram of FIG. 2 according to a first embodiment of the present invention.
Figure 6:
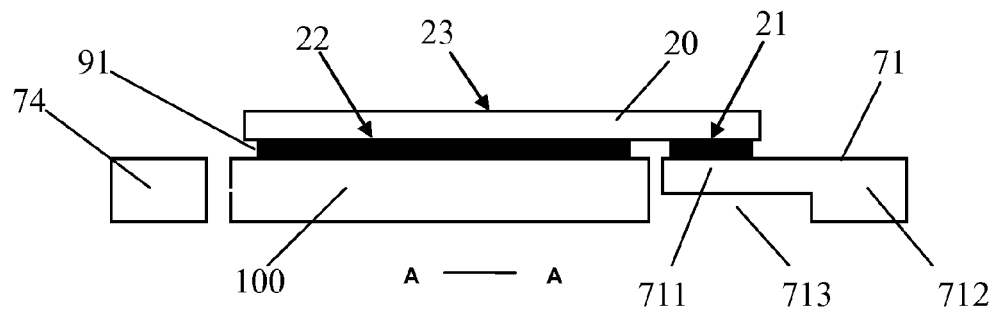
FIG. 6 is a cross-sectional view along line A-A of the co-package of power semiconductor device of FIG. 4 or FIG. 5.

A first embodiment of the present invention is described in FIG. 2, FIG. 4 and FIG. 6. FIG. 4 is a three-dimensional diagram of a co-package of a power semiconductor device, while FIG. 6 is a cross-sectional view along line A-A of the power semiconductor device of FIG. 4. As shown in FIG. 4, P-type HS MOSFET 30, N-type LS MOSFET 20 and an IC controller 40 are co-packed in one package of the power semiconductor device.

The power semiconductor device package includes a lead frame containing a die paddle 100 and a plurality of pins separated from the die paddle 100. The plurality of pins include HS source pin 72, LS gate pin 71, switch pin 74 and a plurality of control pins 75. The die paddle 100 should be large enough to arrange the LS MOSFET 20 and the IC controller 40 side-by-side in the same plane.

As shown in FIG. 6, the LS gate pin 71 includes an outer portion 712 at an outer end and an inner portion 711 at an inner end. A matching gap 101 is formed on a side of the die paddle 100 at the corresponding position to that of inner portion 711 of the LS gate pin 71 to separate the LS gate pin 71 from the die paddle 100.

The flipped LS MOSFET 20 is attached onto the die paddle 100 through a conductive adhesive 91, with the main part of this LS MOSFET 20 being covered on one end of top surface of the die paddle 100, forming an electrical connection between the source 22 and the die paddle 100, while its gate 21 is correspondingly covered on the inner portion 711 of the LS gate pin 71, forming an electrical connection between the gate 21 and the pin 71 through conductive adhesive 91.

A half etched area 713 at the bottom surface of the inner portion 711 is filled with plastic material in packaging process to enhance the connection strength between the inner portion 711 and the LS MOSFET 20. Another half etched area 104 is also formed at a side of the die paddle 100 corresponding to half etched area 713 of the inner portion 711. This half etched area 104 is also filled with plastic material in packaging to simplify the shape of exposed bottom surface of the die paddle 100.

Figure 8:
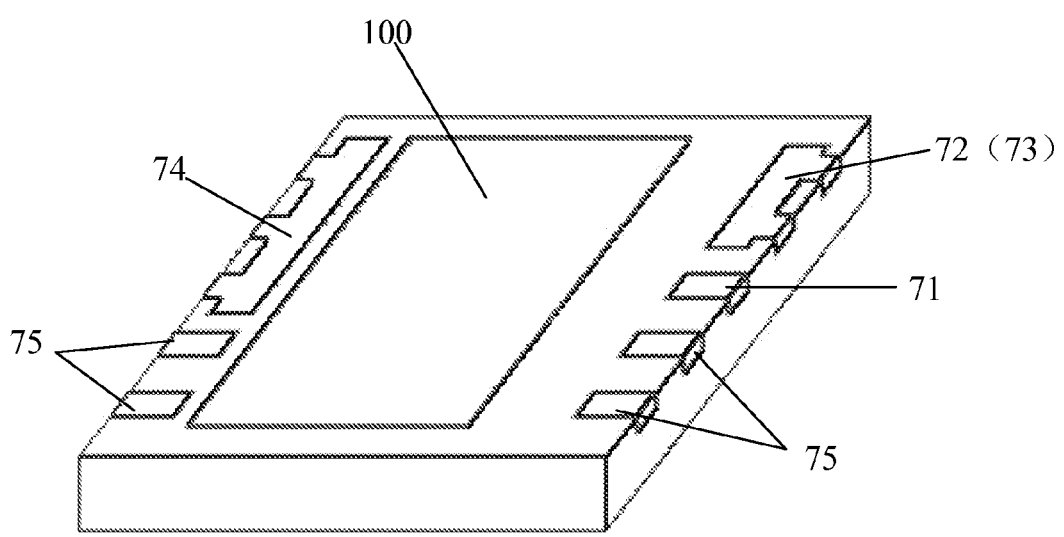
FIG. 8 is a three-dimensional diagram illustrating the co-package of power semiconductor device of FIG. 4 or FIG. 5 from its backside.

The outer portion 712 of the LS gate pin 71 and the bottom surface of die paddle 100, except the half etched area 104, will expose outside the bottom surface of the power semiconductor device after being packaged, as shown in FIG. 8. Source 22 of the LS MOSFET 20 is grounded (Gnd) as shown in FIG. 2 by the connection of the bottom surface of die paddle 100 to ground. In addition, the exposed bottom surface of die paddle 100 improves heat dissipation performance.

The IC controller 40 is attached on the other end of top surface of the die paddle 100. The IC controller 40 has a plurality of electrodes on its top surface, which are connected through boning wires to control pins 75 and the outer portion 712 of the LS gate pins 71.

Figure 7:
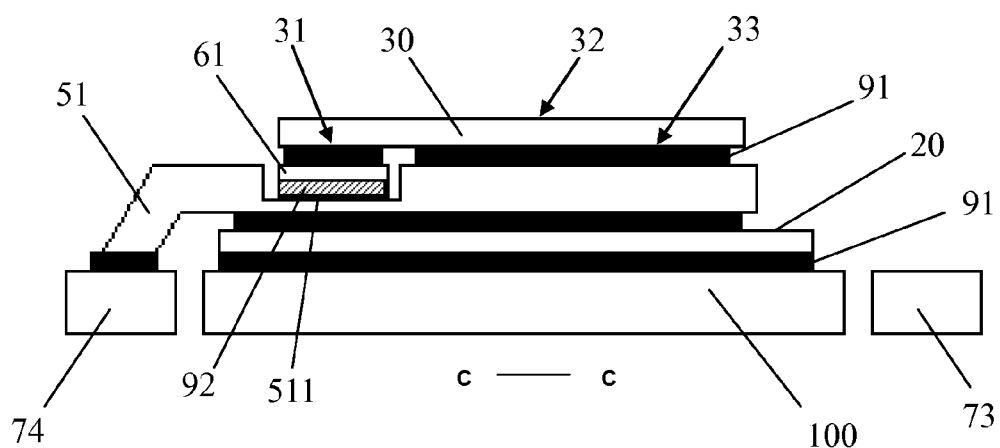
FIG. 7 is a cross-sectional view along line C-C of the co-package of power semiconductor device of FIG. 5, FIG. 10 or FIG. 15.

The first metal interconnection plate 51 (or other metal connects such as metal connecting strips) is connected on top of the LS MOSFET 20 through conductive adhesive 91, forming an electrical connection between the drain 23 of the LS MOSFET 20 and the bottom surface of the first metal interconnection plate 51, and further forming an electrical connection with the switch pin 74 through the first metal interconnection plate 51 as shown in FIG. 7.

The HS MOSFET 30 is attached on the first metal interconnection plate 51 through conductive adhesive 91, forming an electrically connection between its drain 33 and top surface of the first metal interconnection plate 51, thus forming an electrical connection between the HS drain 33 and the LS drain 23 and switch pin 74 through the said first metal interconnection plate 51. The switch pin 74 is electrically connected to electrode of the IC controller 40 by bonding wires 80, forming a circuit connection at switch end Lx, as shown in FIG. 2. Gate 31 and source 32 of the HS MOSFET 30 are also electrically connected to the IC controller 40 by bonding wires 80.

The second metal interconnection plate 52 is attached on top of the HS MOSFET 30 through conductive adhesive 91, forming an electrical connection between source 32 of the HS MOSFET 30 and the second metal interconnection plate 52, and further forming an electrical connection to the HS source pin 72, which forms a power access terminal Vin as shown in FIG. 2.

Figure 5:
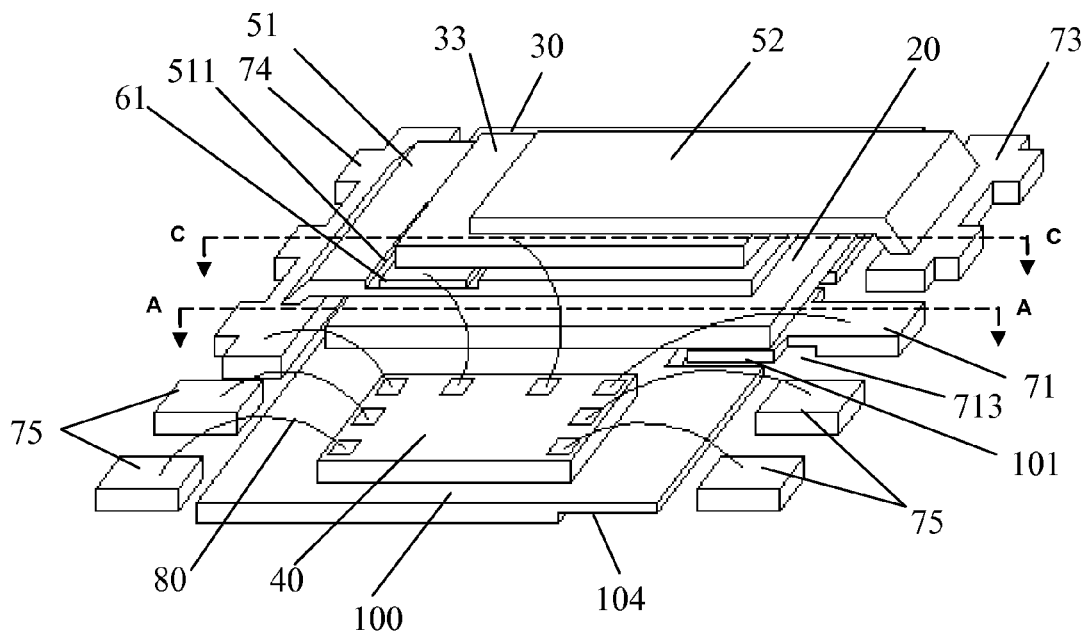
FIG. 5 is three-dimensional diagram illustrating a co-package of power semiconductor device corresponding to the circuit diagram of FIG. 3.

An alternative configuration of a co-package of a power semiconductor device is described in FIG. 3, FIG. 5, FIG. 6 and FIG. 7. FIG. 5 is a three-dimensional diagram of a power semiconductor device package, while FIG. 6 and FIG. 7 are cross-sectional views along line A-A and line C-C respectively of the power semiconductor device package FIG. 5. According to the circuit diagram as shown in FIG. 3, this power semiconductor device package includes the IC controller 40 and both N-type HS and LS MOSFETs.

The structure of the lead frame that includes a die paddle 100 and a plurality of pins and the connecting configuration of the IC controller 40 and LS MOSFET 20 on the die paddle 100 are same as that described above in FIG. 4.

Typically, as shown in FIG. 5, FIG. 6 and FIG. 8, the flipped LS MOSFET 20 is connected on the die paddle 100, with its source 22 being electrically connected with the die paddle 100, and its top gate 21 being electrically connected with the inner portion 711 of the LS gate pin 71. The first metal interconnection plates 51 stacks on top of the LS MOSFET chip 20, forming an electrical connection between drain 23 of the LS MOSFET 20 and the switch pin 74. The die paddle 100 is also connected to the IC controller 40, forming an electrical connection between IC controller 40 and the control pins 75, outer portion 712 of LS gate pin 71, and the switch pin 74 by bonding wires 80. The half etched areas 104 and 713 are filled with plastic material in packaging process. All pins (including the outer portion 712 of LS gate pin 71) and area of bottom surface of die paddle 100, except the half etched area 104, expose from the bottom surface of the power semiconductor device.

In this embodiment, the HS MOSFET 30 is an N-type MOSFET and is also flipped. The flipped HS MOSFET 30 is stacked on the first metal interconnection plate 51, forming an electrical connection between the source 32 of the HS MOSFET 30 and the first metal interconnection plate 51 through conductive adhesive 91. HS source 32 forms electrical connection with LS drain 23 through the first metal interconnection plate 51, and further forms electrical connection with the IC controller 40 through the switch pin 74, forming the switch terminal Lx as shown in FIG. 3.

The gate 31 of the flipped HS MOSFET 30 is connected on the first metal interconnection plate 51 through the first interposer 61 and forms electrical connection between this gate 31 and the IC controller 40 through the first interposer 61.

Specifically, the first groove 511 is formed on a top portion of the first metal interconnection plate 51 with a shape and size conforming with the first interposer 61 and corresponding to the position of gate 31 of the flipped HS MOSFET 30.

The first interposer 61 is insulated from the first metal interconnection plate 51 and is electrically connected with gate 31 of the HS MOSFET 30. By way of example, the first interposer 61 can be a conductive metal plate, with its bottom surface being attached to the first metal connector 51 in the first groove 511 through non-conductive adhesive 92. Alternatively, the first interposer 61 may include a top conductive metal layer and a bottom insulator layer, such as a glass layer, in which the bottom surface of this bottom insulator layer can be connected with the first metal interconnection plate 51 in the first groove 511 through conductive or nonconductive adhesive.

Top surface of the first interposer 61 is electrically connected with the gate 31 of the HS MOSFET 30 through conductive adhesive 91. The top surface of the first interposer 61 is not completely covered by the gate 31 and the boding wire 80 is formed between the IC controller 40 and the first interposer 61 achieving an electrical connection between IC controller 40 and the gate 31 of the HS MOSFET 30.

The second metal interconnection plate 52 is attached on top of the HS MOSFET 30 through conductive adhesive 91, forming an electrical connection between drain 33 of the HS MOSFET 30 and the second metal interconnection plate 52, and further forming an electrical connection with the HS drain pin 73 through the second metal interconnection plate 52, forming a power access terminal Vin as shown in FIG. 3. The IC controller 40 is also electrically connected with the drain 33 through the bonding wire 80.

Figure 9:
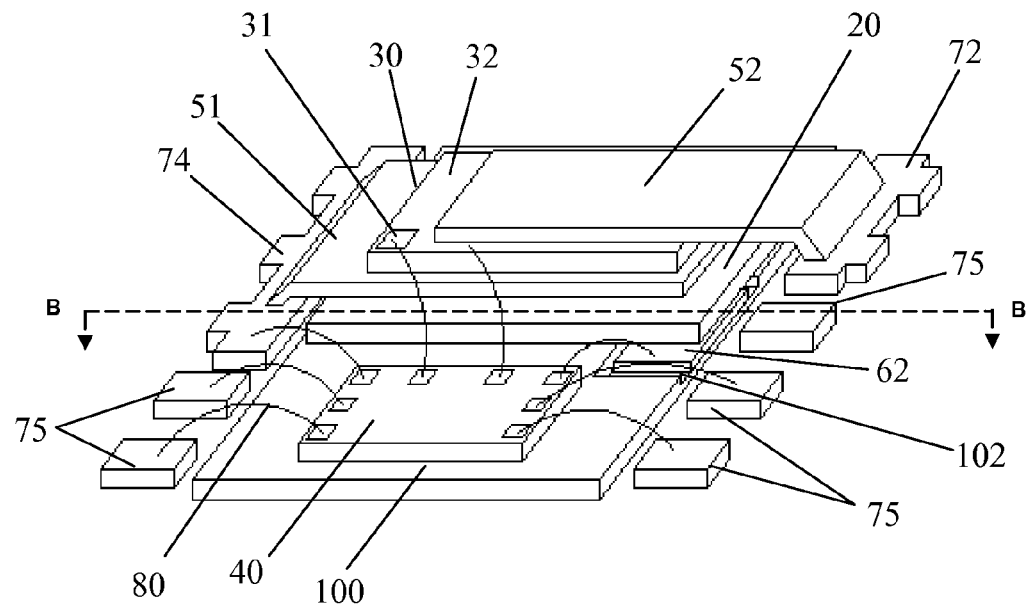
FIG. 9 is a three-dimensional diagram illustrating a co-package of power semiconductor device corresponding to circuit diagram of FIG. 2 according to a second embodiment of the present invention.
Figure 11:
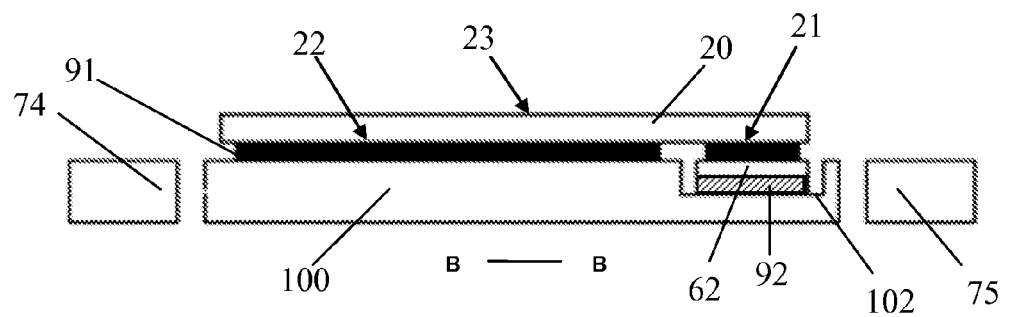
FIG. 11 is a cross-sectional view along line B-B of the co-package of power semiconductor device of FIG. 9 or FIG. 10.

A second embodiment of the present invention is described in FIG. 2, FIG. 9 and FIG. 11, in which, FIG. 9 is three-dimensional diagram of a power semiconductor device co-package, and FIG. 11 is a cross-sectional view of the power semiconductor device co-package of FIG. 9 along line B-B. According to the circuit diagram as shown in FIG. 2, a P-type HS MOSFET 30, an N-type LS MOSFET 20 and an IC controller 40 are co-packaged in this power semiconductor device.

Similar to the structure of the power semiconductor devise as described above in FIG. 4, the IC controller 40 is placed at one end of the die paddle 100 of leads frame, and the flipped LS MOSFET 20, the first metal connector 51, HS MOSFET 30 and the second metal connector 52 are placed at the other end of the die paddle 100. The top surface and bottom surface of the first metal interconnection plate 51 are electrically connected with drain 23 and 33 of the HS and LS MOSFETs 20 and 30 respectively, and further connected the switch pin 74. Bonding wires 80 form an electrical connection between the switch pin 74 and the IC controller 40, forming the switch terminal Lx as shown in FIG. 2. The second metal interconnection plate 52 is electrically connected with source 32 of the HS MOSFET 30 and the HS source pin 72, forming the power input terminal Vin as shown in FIG. 2. The IC controller 40 is also electrically connected to the gate 31 and the source 32 of the HS MOSFET 30, and to the control pins 75 through bonding wires 80.

In this embodiment, a second groove 102 is formed by a half etching a top portion of the die paddle 100 corresponding to the position of gate 21 of the flipped LS MOSFET 20. A second interposer 62 is formed in the second groove 102, and is electrically insulated from the die paddle 100.

Specifically, similar to the first interposer 61, the second interposer 62 can be a conductive metal plate, with its bottom surface being attached to the die paddle 100 in the second groove 102 through a non-conductive adhesive 92. Alternatively, the second interposer 62 may include a top conductive metal layer and a bottom glass layer or other insulator layers, with the bottom insulator layer connecting to the die paddle 100 through either a conductive or a nonconductive adhesive.

Figure 13:
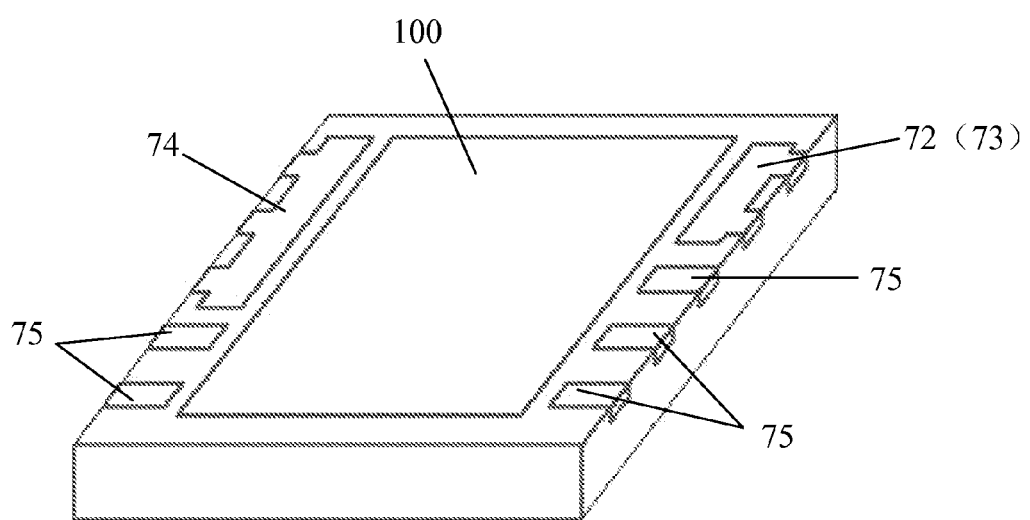
FIG. 13 is a three-dimensional diagram illustrating the co-package of power semiconductor device of FIG. 9, FIG. 10, FIG. 14 or FIG. 15 from its back side.

The gate 21 of the flipped LS MOSFET 20 can be electrically connected to the conductive top surface of the second interposer 62 through conductive adhesive 91. The second interposer 62 is not completely covered by the gate 21, so that a bonding wire 80 is formed between the IC controller 40 and the second interposer 62, achieving an electrical connection between IC controller 40 and the gate 21 of the LS MOSFET 20. At the same time, source 22 of the LS MOSFET 20 can be electrically connected with the top surface of the die paddle 100 through conductive adhesive 91, and grounded as shown in FIG. 2. As the second interposer 62 in this embodiment is placed in the second groove 102 of the die paddle 100, the LS gate pin 71 in FIG. 4 can be replaced with a control pin 75. In this embodiment the bottom surface of the die paddle 100 completely exposes outside the power semiconductor device after its being packaged as shown in FIG. 13, achieving a larger heat dissipating area.

Figure 10:
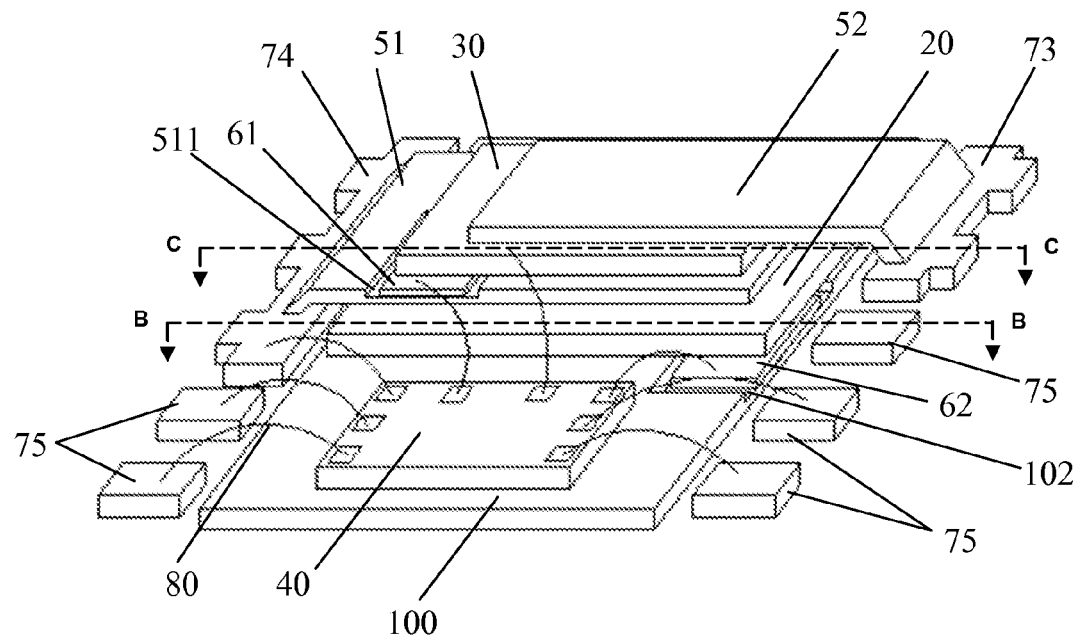
FIG. 10 is a three-dimensional diagram illustrating a co-package of power semiconductor device of corresponding to circuit diagram of FIG. 3.

An alternative configuration of the power semiconductor device is described in FIG. 3, FIG. 7, FIG. 10 and FIG. 11. FIG. 10 is a three-dimensional diagram of the power semiconductor device co-package, while FIG. 7 and FIG. 11 are cross-sectional views of the power semiconductor device co-package in FIG. 10 along line C-C and line B-B respectively. According to the circuit diagram as shown in FIG. 3, this power semiconductor device co-package includes the IC controller 40 and both N-type HS and LS MOSFETs 20 and 30.

In this embodiment, the IC controller 40 is positioned on one end of the die paddle 100 of leads frame, and flipped LS MOSFET 20, the first metal interconnection plate 51, flipped HS MOSFET 30 and the second metal interconnection plate 52 are positioned on the other end of the die paddle 100.

Similar as above, a second interposer 62 is placed on and is electrically insulated from the die paddle 100 in the second groove 102. The flipped LS MOSFET chip 20 is stacked on the die paddle 100 and the second interposer 62, forming electrical connection between source 22 of the LS MOSFET 20 and the die paddle 100 through the conductive adhesive 91, with its gate 21 being electrically connected with the conductive top surface of the second interposer 62. The first metal interconnection plate 51 is stacked on the LS MOSFET 20, forming an electrical connection between drain 23 of the LS MOSFET chip 20 and the switch pin 74.

The first groove 511 is formed on a top portion of the first metal interconnection 51 with the first interposer 61 is attached on the first metal interconnection plate 51 in the first groove 511. Gate 31 of the flipped N-type HS MOSFET 30 is electrically connected with the conductive top surface of the first interposer 61. At the same time, source 32 of the HS MOSFET 30 is electrically connected with the top surface of the first metal interconnection plate 51, therefore electrically connected to the drain 23 of the LS MOSFET 20, and the switch pin 74, forming a switch terminal Lx, as shown in FIG. 3. The second metal interconnection plate 52 located above the drain 33 of the HS MOSFET 30 is electrically connected to the HS drain pin 73, forming a power access terminal Vin as shown in FIG. 3. The IC controller 40 is electrically connected to the control pins 75, top conductive surface of the first and second interposers 61 and 62, the switch pin 74, and drain 33 of the HS MOSFET 30 through the bonding wires 80.

As shown in FIG. 13, the whole bottom surface of die paddle 100 in this embodiment can be exposed completely outside the power semi-conductor device after being packaged as a ground, as such the source 22 of LS MOSFET 20 is also grounded as shown in FIG. 3. The exposed bottom surface of die paddle 100 improves heat dissipation.

Figure 12:
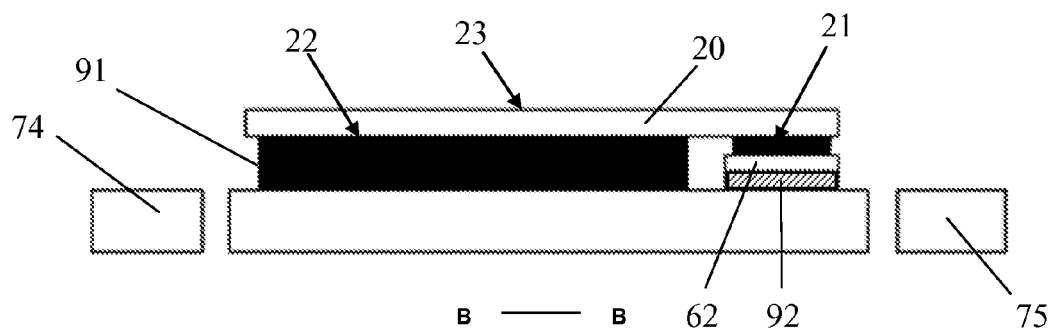
FIG. 12 is an alternative cross-sectional view along line B-B of the co-package of power semiconductor device of FIG. 9 or FIG. 10.

FIG. 12 is an alternative structure of FIG. 11. As shown in FIG. 12, the flipped LS MOSFET 20 is stacked on top of the die paddle 100 through conductive adhesive 91 forming an electrical connection between the source 22 of LS MOSFET 20 and the die paddle 100. The second interposer 62 is stacked on top and insulated from the die paddle 100 with the top surface of second interposer 62 electrically connected to the gate 21 through conductive adhesive. The conductive adhesive 91 between the LS MOSFET 20 and the die paddle 100 is thick enough such that the top surface of the conductive adhesive 91 between the LS MOSFET 20 and the die paddle 100 and the top surface of the conductive adhesive between the second interposer 62 and the LS MOSFET 20 are co-planar.

Figure 14:
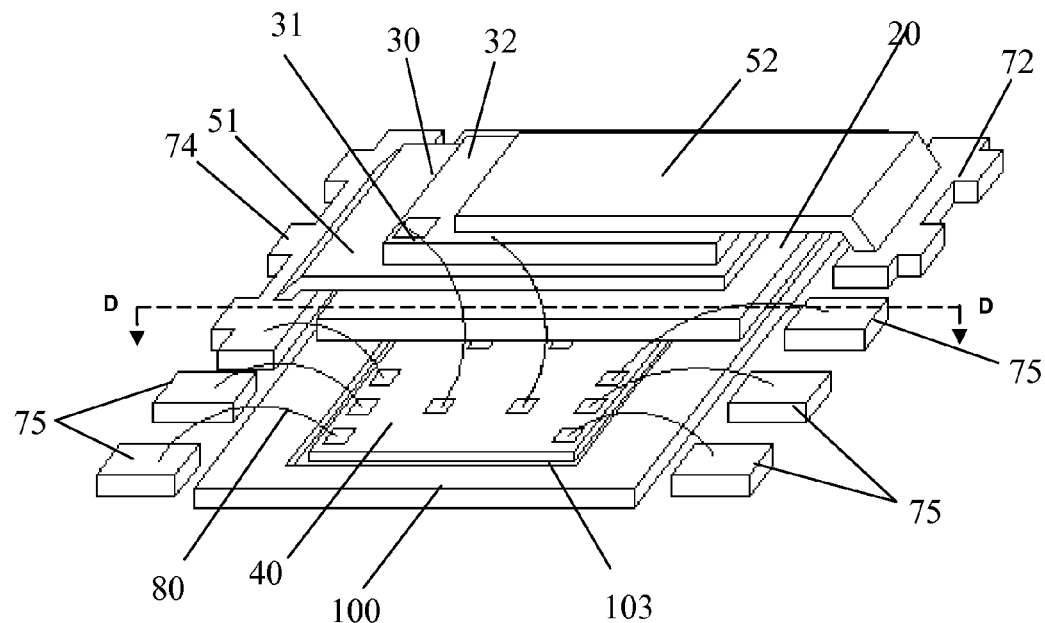
FIG. 14 is a three-dimensional diagram illustrating a co-package of power semiconductor device corresponding to circuit diagram of FIG. 2 according to a third embodiment of the present invention.
Figure 16:
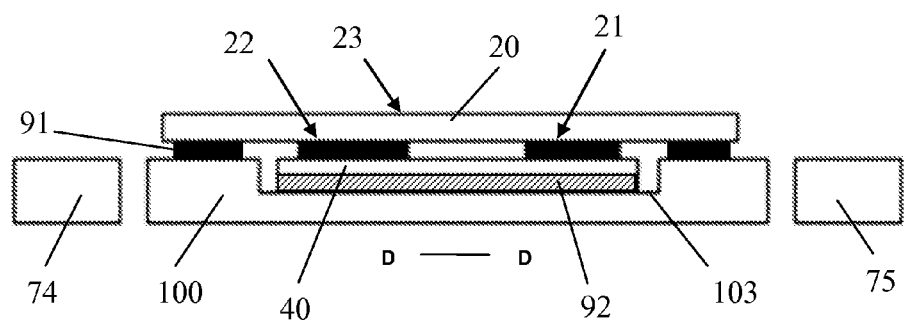
FIG. 16 is a cross-sectional view along line D-D of the co-package of power semiconductor device of FIG. 14 or FIG. 15.

A third embodiment of the present invention is described in FIG. 2, FIG. 14 and FIG. 16, in which, FIG. 14 is a three-dimensional diagram of the power semiconductor device, and FIG. 16 is a cross-sectional view of the power semiconductor device in FIG. 14 along line D-D. According to the circuit diagram as shown in FIG. 2, P-type HS MOSFET 30, N-type LS MOSFET 20 and IC controller 40 are co-packaged.

In this embodiment, the flipped LS MOSFET 20, the first metal interconnection plate 51, HS MOSFET 30, second metal interconnection plate 52 are stacked on top each other on the die paddle 100 of the lead frame in a similar structure as described above in FIG. 4 and FIG. 9. Typically, top and bottom surfaces of the first metal interconnection plate 51 are electrically connected with drain 23 and drain 33 of the HS and LS MOSFETs respectively, and further connected to the switch pin 74, forming the switch terminal Lx as shown in FIG. 2.

The second metal interconnection plate 52 is stacked on top of the HS MOSFET chip 30 and is electrically connected with its top source 32, and further connected to the HS source pin 72, forming the power input terminal Vin as shown in FIG. 2.

In this embodiment, a chip groove 103 is formed by half etching area top portion of the die paddle 100. This chip groove 103 has a shape and size conforming to the shape and size of the IC controller 40, such that the IC controller 40 can be positioned in the chip groove 103 and is insulated from the die paddle 100.

For example, a chip groove 103 of a depth of 4 μm can be formed by half etching for an IC controller 40 with a height of 4 μm, making top surface of the IC controller 40 located in the chip groove 103 at the same level with the top surface of the die paddle 100. The flipped LS MOSFET 20 covers a portion of top surface of the IC controller 40, with its gate 21 and a portion of source 22 being directly electrically connected with some electrodes on top surface of the IC controller 40 through conductive adhesive 91, which eliminates the utilization of the bonding wire and simplifies the packaging process. The remaining sources 22 of the LS MOSFET 20 is electrically connected with top surfaces of the die paddle 100 excluding the chip groove 103 through a conductive adhesive 91. The bottom surface of the die paddle 100 can be exposed completely outside the power semi-conductor device after being packaged, as shown in FIG. 13, resulting the remaining of source 22 of the LS MOSFET 20 being grounded as shown in FIG. 2. The exposed bottom surface of die paddle 100 also improves heat dissipation. The IC controller 40 is also electrically connected with the control pin 75, the switch pin 74, gate 31 and source 32 of the HS MOSFET 30 by the bonding wires.

In the above embodiments, the IC controller 40 is arranged on the same plane with the LS MOSFET 20 on the top surface of the die paddle 100. In this embodiment, the IC controller 40 is placed in the chip groove 103 of the die paddle 100 and the LS MOSFET 20 is stacked on top of the IC controller 40, forming a three-dimensional package structure. Thus, in this embodiment, the LS MOSFET 20 and the IC controller 40 can be placed on different planes in the die paddle 100 with the same area, as such each of them can enlarge their own area to improve the performance of the power semi-conductor device.

Figure 15:
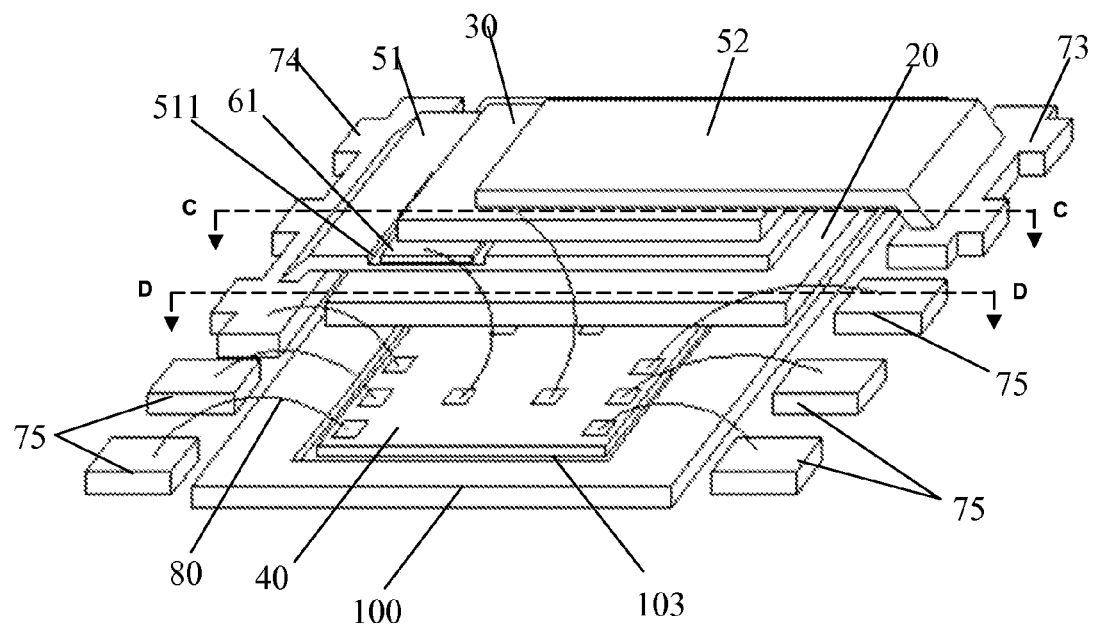
FIG. 15 is a three-dimensional diagram illustrating a co-package of power semiconductor device corresponding to circuit diagram of FIG. 3.

An alternative configuration is described in FIG. 3, FIG. 7, FIG. 15 and FIG. 16, in which, FIG. 15 is a three-dimensional diagram of the power semiconductor device, while FIG. 7 and FIG. 15 are cross-sectional views of the power semiconductor device in FIG. 15 along line C-C and line D-D respectively. According to the circuit diagram as shown in FIG. 3, this power semiconductor device is a co-package of the IC controller 40 and N-type HS and LS MOSFETs. Similar to the above configuration, the IC controller 40 is placed in the chip groove 103, which is formed by half etching on a top portion of die paddle 100, and is electrically insulated from the die paddle 100.

The flipped MOSFET 20 covers a portion of top surface of IC controller 40, making direct connection between its gate 21 and source 22 with some electrodes on top surface of IC controller 40. The remaining source 22 of the LS MOSFET 20 is electrically connected with top surfaces of the die paddle 100 excluding the chip groove 103 area. The bottom surface of the die paddle 100 can be exposed completely outside the power semi-conductor device after being packaged, as shown in FIG. 13, as such the remaining portion of source 22 of the LS MOSFET 20 is grounded as shown in FIG. 3.

In this embodiment, the flipped LS MOSFET 20, the first metal interconnection plate 51, the flipped HS MOSFET chip 30, and the second metal interconnection plate 52 is stacked on top each other in a similar order as described above. Specifically, the first metal interconnection plate 51 is stacked on the LS MOSFET 20, forming an electrical connection between drain 23 of the LS MOSFET 20 and the switch pin 74. A portion of the top surface of the first metal interconnection plate 51 is half-etched to form the first groove 511, and a first interposer 61 is placed in the first groove 511.

The gate 31 of the flipped N-type HS MOSFET 30 is electrically connected to the conductive top surface of the first interposer 61. The source 32 of the HS MOSFET 30 is electrically connected to the top surface of the first metal interconnection plate 51, thus electrically connected to the drain 23 of the LS MOSFET 20, and switch pin 74, forming a switch terminal Lx, as shown in FIG. 3.

The drain 33 of the HS MOSFET 30 is electrically connected to the HS drain pin 73 through the second metal interconnection plate 52, forming a power access terminal Vin as shown in FIG. 3. The IC controller 40 is electrically connected to control pins 75, switch pin 74, top surface of the first interposer 61, and drain 33 of the HS MOSFET 30 through bonding wires 80.

Figure 17:
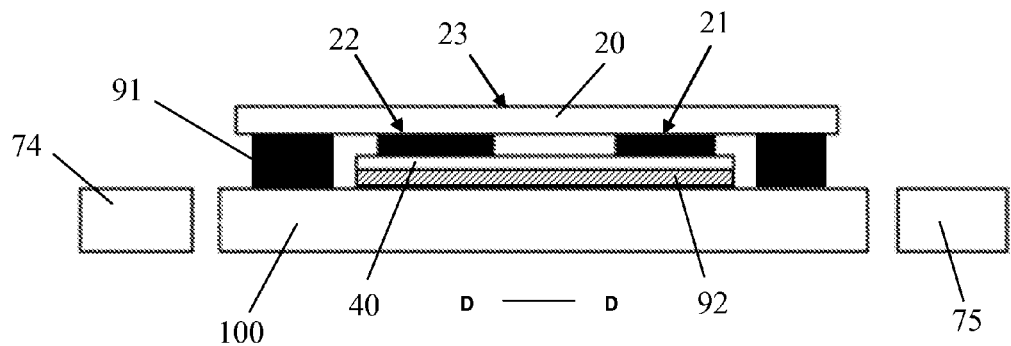
FIG. 17 is an alternative cross-sectional view along line D-D of the co-package of power semiconductor device of FIG. 14 or FIG. 15.

FIG. 17 is an alternative structure of FIG. 16. As shown in FIG. 17, the IC controller 40 is stacked on and insulated from the die paddle 100 without forming a groove on top portion of the die paddle. The flipped LS MOSFET 20 covers a portion of top surface of IC controller 40, with its gate 21 and a portion of source 22 being electrically connected to some electrodes on top surface of IC controller 40 by a conductive adhesive. The remaining of source 22 of the LS MOSFET 20 is electrically connected to the die paddle 100 through a thick conductive adhesive 91, which is thick enough such that the top surface of the thick conductive adhesive between the remaining source 22 and the die paddle 100 and the top surface of the conductive adhesive between the portion of source 22 and the IC controller are co-planar.

Figure 18:
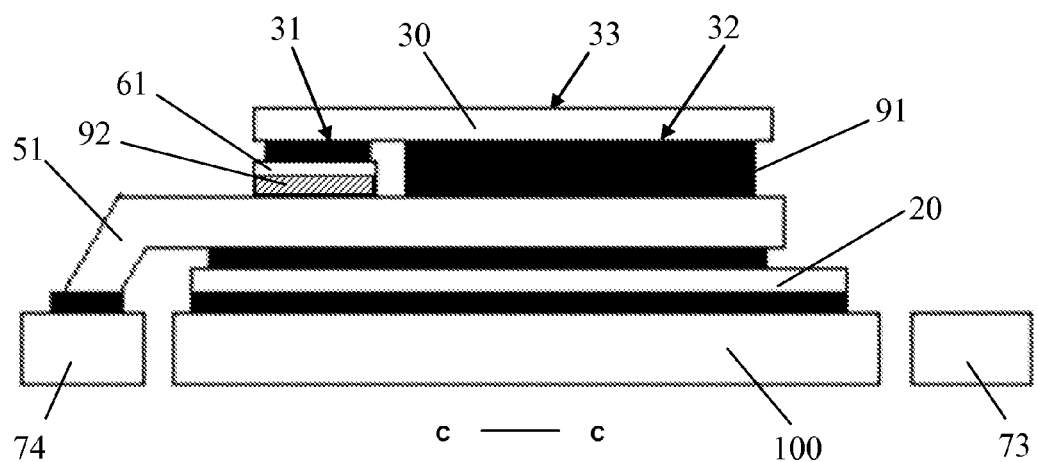
FIG. 18 is an alternative cross-sectional view along line C-C of the co-package of power semiconductor device of FIG. 5, FIG. 10 or FIG. 15.

In addition, FIG. 18 is an alternative structure of FIG. 7. In FIG. 7, the first groove 511 is formed in a top portion of the first metal interconnection plate 51 for housing the first interposer 61. In FIG. 18, the flipped HS MOSFET 30 is stacked on the first metal interconnection plate 51 and the first interposer 61 is directly stacked on and insulated from the first metal interconnection plate 51, with the top surface of the first interposer 61 being electrically connected with the gate 31 through conductive adhesive. Source 32 of the HS MOSFET 30 is electrically connected with the first metal interconnection plate 51 through a thick conductive adhesive 91, which is thick enough such that the top surface of the thick conductive adhesive between the source 32 and the first metal interconnection plate 51 and the top surface of the conductive adhesive between the gate 31 and the first metal interconnection plate 51 are co-planar.

The combined packaged power semiconductor device in this invention includes the LS MOSFET, the first metal interconnection plate, the HS MOSFET and the second metal interconnection plate stacked on top each other on a die paddle, achieving a three-dimensional package that reduces the overall size of the power semi-conductor device.

Although the contents of this invention have been described in detail in the above said preferred embodiments, it should be recognized that the above description shall not be considered as a limitation on this invention. After reading the above description by technical personnel in this field, a number of modifications and replacements for this invention will be obvious. Therefore, the scope of protection for this invention shall be limited by the attached claims.

The invention claimed is:

1. A combined packaged power semiconductor device, comprising:
a high-side (HS) MOSFET and a low-side (LS) MOSFET, each of said HS and LS MOSFETs comprising a bottom drain, a top gate and a top source;
a lead frame comprising a die paddle and a plurality of pins separated and electrically insulated from said die paddle, wherein said LS MOSFET is flipped and stacked on said die paddle forming an electrical connection between said LS source and a top surface of said die paddle, as such said LS source is electrically connected to an exposed bottom surface of said die paddle;
a first metal interconnection plate stacked on said drain of said LS MOSFET, wherein said HS MOSFET directly stacked or flipped first and then stacked on said first metal interconnection plate, forming an electrical connection between said HS drain or flipped HS source and said LS drain through said first metal interconnection plate;
a second metal interconnection plate stacked and electrically connected to said source of said HS MOSFET or said drain of said flipped HS MOSFET;
an integrated circuit (IC) controller stacked on said die paddle, said IC controller comprising a plurality of electrodes, wherein electrical connections between said pins, said electrodes on said IC controller and electrodes of HS and LS MOSFETs are formed;
an interposer wherein said gate of flipped LS MOSFET is electrically connected to a conductive top surface of said interposer and a bottom surface of said interposer is stacked on and electrically insulated from said die paddle; and
a second groove formed by half etching a top portion of the die paddle corresponding to the position of a gate of the flipped LS MOSFET with a second interposer formed in the second groove while electrically insulated from the die paddle.

2. The combined packaged power semiconductor device of claim 1, wherein said source of said LS MOSFET is electrically connected to said die paddle through a thick conductive adhesive, wherein said thick conductive adhesive is thick enough such that a top surface of said conductive adhesive between said LS MOSFET and said die paddle and a top surface of a conductive adhesive between said second interposer and said LS MOSFET are co-planar.

3. The combined packaged power semiconductor device of claim 1, wherein a groove is formed at a top surface of said die paddle corresponding to a position of said gate of said LS MOSFET and wherein said interposer is placed in said groove and is electrically insulated from said die paddle.

4. The combined packaged power semiconductor device of claim 1, wherein said second interposer is a conductive metal plate with its bottom surface being connected on said die paddle or in said second groove through a non-conductive adhesive.

5. The combined packaged power semiconductor device of claim 1, wherein said interposer comprises a conductive metal upper layer and an insulated lower layer, wherein a bottom surface of said insulated lower layer is connected on said die paddle or in said groove through an adhesive.

6. The combined packaged power semiconductor device of claim 1, wherein said IC controller is electrically connected with a top surface of said interposer, forming an electrical connection with said gate of said flipped LS MOSFET.

* * * * *